(12) United States Patent
Hersee et al.

(10) Patent No.: US 6,596,377 B1
(45) Date of Patent: Jul. 22, 2003

(54) THIN FILM PRODUCT AND METHOD OF FORMING

(75) Inventors: Stephen D. Hersee, Albuquerque, NM (US); David Zubia, Albuquerque, NM (US); Steven R. J. Brueck, Albuquerque, NM (US); Saleem H. Zaidi, Albuquerque, NM (US)

(73) Assignee: Science & Technology Corporation @ UNM, Albuquerque, NM (US)

( * ) Notice: Subject to any disclaimer, the term of this patent is extended or adjusted under 35 U.S.C. 154(b) by 0 days.

(21) Appl. No.: 09/535,732

(22) Filed: Mar. 27, 2000

(51) Int. Cl.$^7$ ............................. C30B 25/02; B32B 9/00
(52) U.S. Cl. ................... 428/195; 428/312.2; 428/446; 428/448; 428/698
(58) Field of Search ................................. 428/446, 448, 428/304.4, 195, 312.2, 698; 117/72; 438/689

(56) References Cited

U.S. PATENT DOCUMENTS

| | | | |
|---|---|---|---|
| 4,482,422 A | * 11/1984 | McGinn et al. | 156/612 |
| 4,549,926 A | * 10/1985 | Corboy, Jr. et al. | 156/612 |
| 5,032,893 A | * 7/1991 | Fitzgerald, Jr. et al. | 357/60 |
| 5,202,284 A | * 4/1993 | Kamins et al. | 437/89 |
| 5,705,321 A | 1/1998 | Brueck et al. | 430/316 |
| 5,830,532 A | * 11/1998 | Tang et al. | 427/255 |
| 6,042,998 A | 3/2000 | Brueck et al. | 430/316 |
| 6,184,144 B1 | * 2/2001 | Lo | 438/703 |

FOREIGN PATENT DOCUMENTS

WO    WO 99/19546    * 4/1999

OTHER PUBLICATIONS

S.D. Hersee, J. Ramer, K. Zheng, C. Kranenberg, K. Malloy, M. Banas and M. Goorsky; The Role of the Low Temperature Buffer Layer and Layer Thickness in the Optimization of OMVPE Growth of GaN on Sapphire; Journal of Electronic Matrials, vol. 24, No. 11, 1995, pp. 1519–1523 (No Month).

Saleem H. Zaidi and S. R. J. Brueck; Nonlinear Processes to Extend Interferometric Lithography; SPIE 3676 Microlithography '99 Emerging Technologies III; pp. 371–378 1999 (No Month).

Serge Luryi and Ephraim Suhir; New Approach to the High Quality Epitaxial Growth of Lattice–Mismatched Materials, Appl. Phys. Lett. 49 (3), Jul. 21, 1986; 140–142.

S. D. Hersee, E. Barbier and R. Blondeau; A Study of the Orientation Dependence of Ga(Al) As Growth by MOVPE; Journal of Crystal Growth 77 (1986) 310–320 (No Month).

H. Marchand, X. H. Wu, J. P. Ibbetson, P. T. Fini, P. Kozodov, S. Keller, J. S. Speck, S. P. DenBaars, and U. K. Mishra; Microstructure of GaN Laterally Overgrown by Metalorganic Chemical Vapor Deposition; Applied Physics Letters, vol. 73, No. 6, Aug. 10, 1998; pp. 747–749.

A. Goldstein; Reduced Size and Dimensions, Handbook of Nanophase Materials; Marcel Dekker, New York (1997); pp 3–4 (No Month).

* cited by examiner

Primary Examiner—Deborah Jones
Assistant Examiner—Stephen Stein
(74) Attorney, Agent, or Firm—Snell & Wilmer L.L.P.

(57) ABSTRACT

A new and useful technique for growing an epilayer onto a substrate is provided. An epilayer is grown on a substrate by (a) providing a patterned substrate comprising a plurality of isolated nanoscale nucleation sites, and (b) growing an epilayer selectively on the nanoscale nucleation sites, in a manner which localizes strain at the substrate-epilayer interface, and enables strain to reduce as the thickness of the epilayer increases.

16 Claims, 8 Drawing Sheets

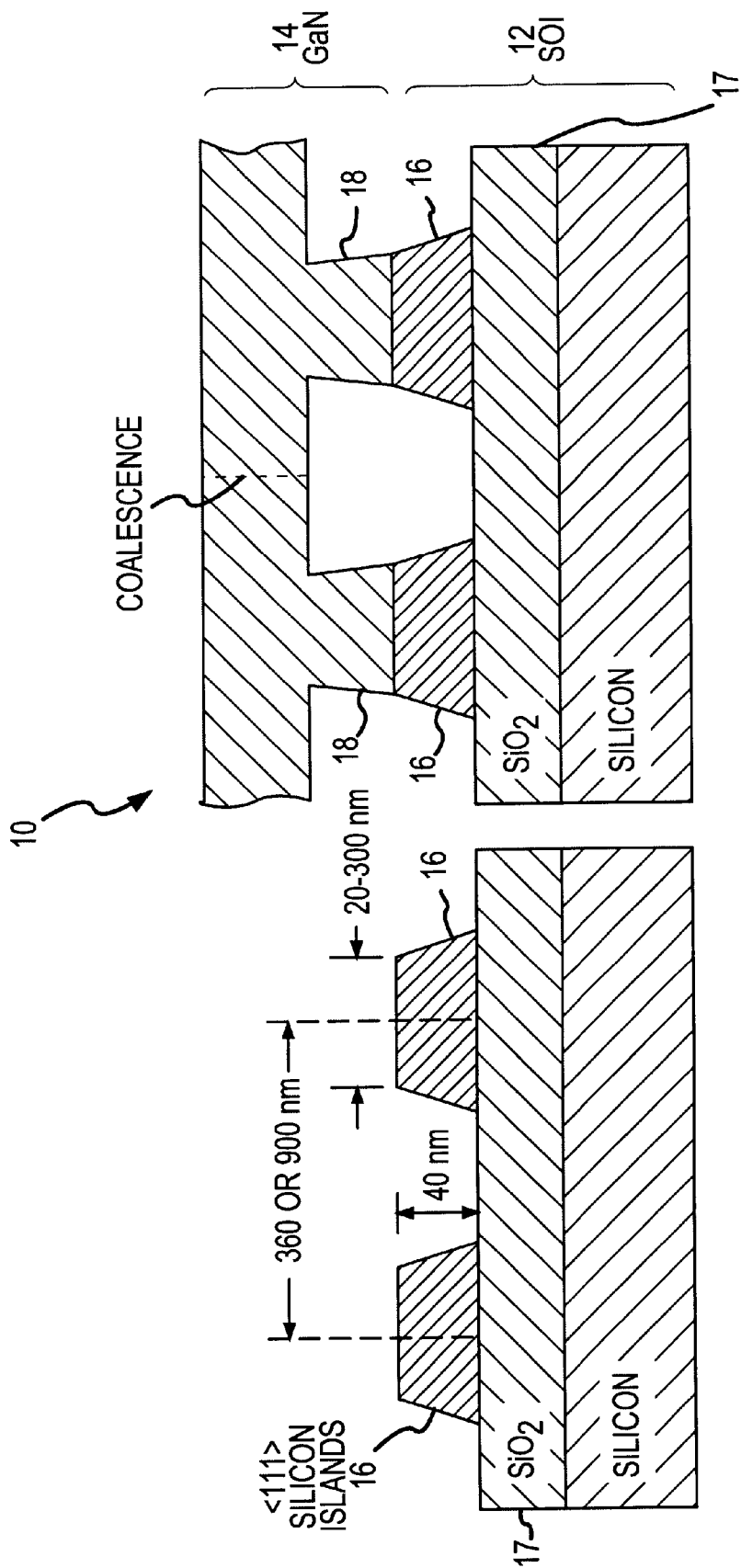

GaN/Si INTERFACE

TOP OF GaN ISLAND

THIN FILM PRODUCT AND METHOD OF FORMING

GOVERNMENT SUPPORT

Partial support for this invention was provided by the Air Force Office of Scientific Research, under Research Grant No. F49620-96-1-0079. The Government may have rights in this invention.

FIELD OF THE INVENTION

The present invention relates to forming a thin film product, and particularly to a thin film product in which a thin film structure is disposed on a patterned substrate having nanoscale nucleation sites, where the thin film structure and the patterned substrate are heterogeneous, i.e. they are composed of different materials.

BACKGROUND

In forming an electronic workpiece (e.g. of the type which is useful as an electronic device, as an optoelectronic device, etc) it is known to form a thin film product by growing one or several epitaxial layers (epilayers) onto a substrate. The thin film product is processed (e.g. by the formation of electronic components and circuits) to create a particular type of electronic workpiece. When a thin film product is formed with an epilayer having the same crystalline orientation as that of the substrate onto which the epilayer is grown, the epilayer is referred to as an "epitaxial layer" and the process of growing the epilayer on the substrate is referred to as "epitaxial" film growth.

Epitaxial film growth has progressed from homoepitaxy (epilayer material same as substrate material) to lattice matched heteroepitaxy (epilayer material different from substrate material but lattice structure and spacing of film very close to that of substrate) to pseudomorphic, lattice mismatched heteroepitaxy (epilayer material different from substrate material, lattice spacing of epilayer different from lattice spacing of substrate, and strain accommodated in very thin films forming at least part of the epilayer).

A problem which has been recognized in connection with lattice mismatched heteroepitaxy has been the effect of material defects such as dislocations and stacking faults due to mismatch stress on the electronic and optical characteristics of the final devices and circuits. Heretofore, a problem has been that the mismatch stress present at the substrate/epilayer interface remains constant throughout the film as growth proceeds and consequently the strain energy grows linearly with epilayer thickness. Dislocations are then eventually created in the epilayer as the integrated strain energy becomes larger than the energy required to nucleate a defect. This has limited defect-free, heterogeneous film growth to very thin layers below the critical thickness at which dislocations form. Often these thicknesses are not sufficient for optimizing device properties.

Theoretical work reported in 1986 by Luryi and Suhir in "Applied Physics Letters" [New Approach to the High Quality Epitaxial Growth of Lattice-Mismatched Materials, Appl. Phys. Lett. Vol. 49, pp. 140-142 (1986)] suggested that when epitaxial growth was restricted to small, isolated areas of patterned substrates, a higher degree of substrate lattice mismatch could be accommodated in an epilayer, and that defect-free growth thicknesses larger than possible for large area growth could be achieved.

In addition, some of the problems discussed above in connection with epitaxial structures and products can also be encountered in forming non epitaxial structures and products by techniques in which thin film structures are deposited on heterogeneous patterned substrates having nanoscale nucleation sites and it is desirable to reduce strain due to differences in thermal expansion coefficients of the thin film structures and the patterned substrates.

SUMMARY OF THE PRESENT INVENTION

One aspect of the present invention relates to a new and useful application of nanoheteroepitaxy for the growth of thin films in a manner which further reduces strain at the substrate-epilayer interface. An epilayer is grown on a substrate by: (a) providing a patterned substrate comprising a plurality of discrete, nanoscale islands ("nucleation sites"), and (b) selectively growing an epilayer atop each of these islands but not in the spaces between the islands, in a manner which localizes and apportions strain at the substrate-epilayer interface, and enables strain to reduce as the thickness of the epilayer increases. Depending on the specific material parameters, strain-related defects are either completely eliminated or confined to the same inactive region near the substrate-epilayer interface. The strain is shared between the substrate and the epilayer rather than being confined almost exclusively to the epilayer as in the Luryi and Suhir procedure. This enables an epilayer which is substantially defect free to be grown to thicknesses well beyond that predicted by Luryi and Suhir for identically sized epitaxial nucleation island regions.

An additional aspect of the present invention is the use of active compliance, wherein advantage is taken of the modification of elastic moduli in nanoscale materials.

The principles of the present invention are particularly effective at growing an epilayer on a heterogeneous substrate.

Moreover, the principles of the present invention are believed to have more general application in forming thin film structures on heterogeneous patterned substrates having nanoscale nucleation sites, where it is desirable to reduce strain due to differences in thermal expansion coefficients of the thin film structures and the patterned substrates.

Still further, with the principles of the present invention, an electronic and/or optoelectronic workpiece can be created in which strain defects are localized at an inactive region of the electronic and/or optoelectronic workpiece, and their density decreases with increasing epilayer thickness, so that the active regions of the epilayer are substantially defect free.

In this application, reference to "nanosized" islands (or nucleation sites) is intended to mean linear dimensions less than ~100 nm, and a "nanosized epilayer" is intended to mean an isolated epilayer segment grown substantially atop a single nanosized island. Moreover, the concept of "substantially" reduced strain in an epilayer or an epilayer being "substantially" defect free is intended to mean a layer with sufficiently low defect density that it is usable for device applications. The specific levels required vary from device to device and are a function of many parameters and aspects of the device performance which differ between applications.

Further features of the present invention will become further apparent from the following detailed description and the accompanying drawings.

BRIEF DESCRIPTION OF DRAWINGS

FIGS. 1(a), 1(b) are schematic illustrations of portions of a thin film product, and illustrating at FIG. 1(b) an epilayer of gallium nitride (GaN) grown on a patterned silicon on insulator (SOI) substrate according to the principles of the present invention;

DETAILED DESCRIPTION

As discussed above, one aspect of the present invention relates to a new and useful application of nanoheteroepitaxy for the growth of thin films, in a manner which localizes and apportions strain at the substrate-epilayer interface, and enables strain to decay significantly with increasing epilayer thickness. The following detailed description relates to application of the principles of the present invention for growing a GaN (a type III nitride) epilayer on patterned <111> oriented silicon-on-insulator substrate by organometallic vapor phase epitaxy (OMVPE) growth techniques. Alternatively, other advanced epitaxial growth techniques which can be used to grow the epilayer, including but not limited to molecular-beam epitaxy (MBE) or metal-organic molecular beam epitaxy (MOMBE) or atomic layer epitaxy (ALE) are subjects of this invention.

In addition, the principles of the present invention can be used to produce thin film products with other heterogeneous epilayer/substrate materials such as Si—Ge/Si; binary/ternary/quaternary III-V/SOI, ternary/quaternary III-V/binary III-V, and so on, where SOI refers to silicon-on-insulator material, III-V to a semiconductor composed of elements from group III and group V of the periodic table such as, but not limited to, GaAs. Ternary compounds include, by way of example, InGaAs; quaternary III-V alloys include, by way of example, InGaAsP and InGaAsSb.

Figure 1C:
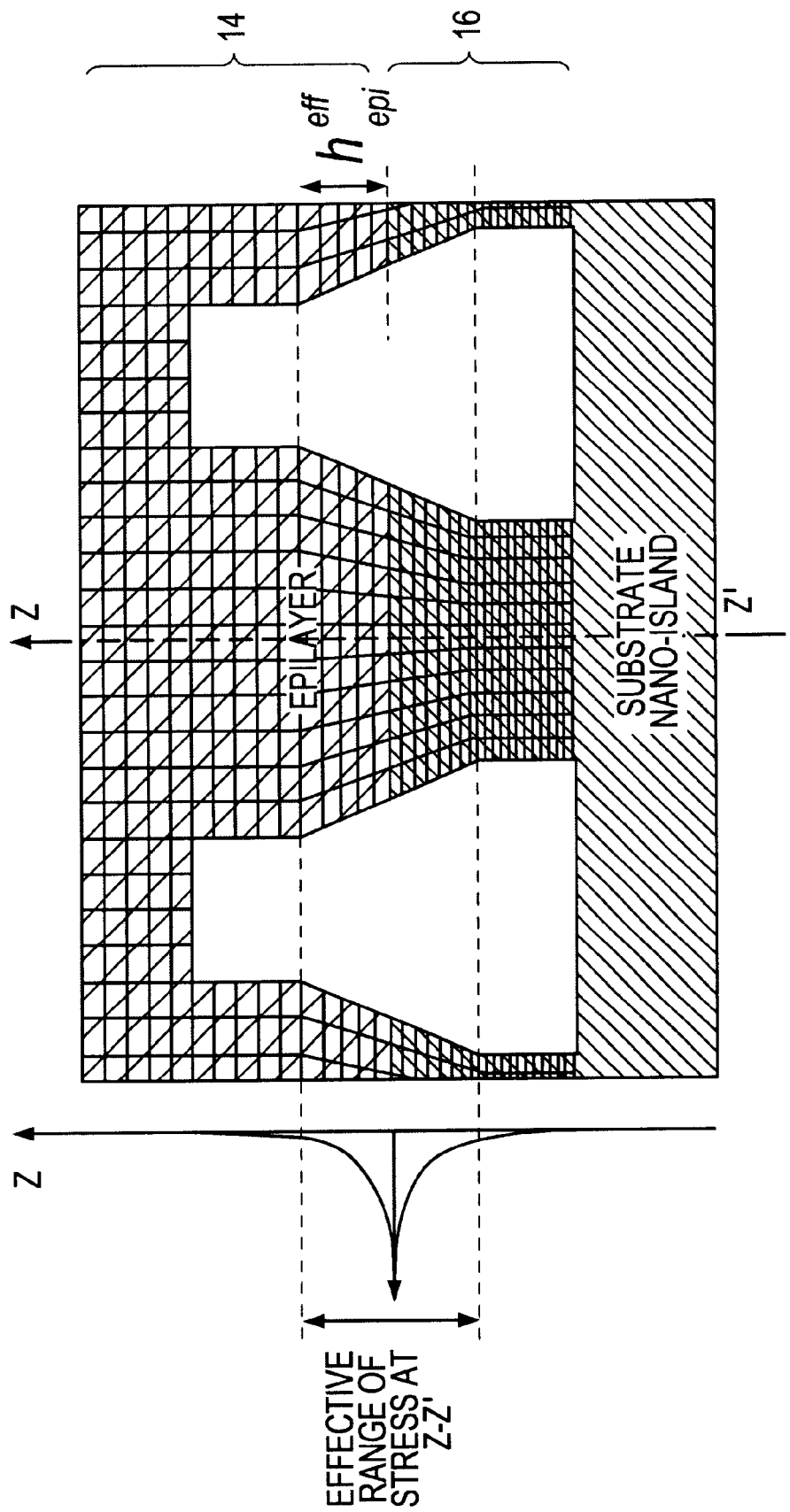
FIG. 1(c) is a schematic illustration of a thin film product with a nanoheleroepitaxially grown epilayer, and illustrating the manner in which stress/strain are apportioned between a nanosized nucleation site and an epilayer grown on that site, according to the principles of the present invention.

FIGS. 1(a)–1(c) schematically illustrate the configuration of a thin film product 10 produced by the principles of the present invention. The thin film product 10 includes a patterned substrate 12 and an epilayer 14 comprising epitaxial film layers grown onto the substrate 12, in a manner described below. The substrate 12 is a patterned <111> oriented silicon-on-insulator (SOI) substrate which can be produced in various ways. It can be produced by the techniques disclosed in U.S. Pat. No. 5,705,321—S. R. J. Brueck, An-Shiang Chu, Saleem Zaidi, and Bruce L. Draper, Methods for Manufacture of Quantum Sized Periodic Structures in Si Materials (issued Jan. 6, 1998) which discusses the use of interferometric lithography, etching and oxidation to form "quantum sized" structures (e. g. the ~100 nm nanosized islands). A copy of U.S. Pat. No. 5,705,321 is Exhibit A hereto, and U.S. Pat. No. 5,705,321 is incorporated herein by reference. Additionally, the substrate 12 can be produced by advanced interferometric lithography techniques, as disclosed in U.S. application Ser. No. 08/932,428, filed Sep. 17, 1997, and entitled "Method And Apparatus For Extending Spatial Frequencies in Photolithography Images". The '428 patent application (Exhibit B) increases the density of islands beyond the linear systems limit of interferometric lithography (given by d=λ/2, where d is the center to center distance between islands). A copy of application Ser. No. 08/932,428 is attached hereto as Exhibit B and is incorporated herein by reference.

Essentially, the patterned substrate 12 comprises a plurality of isolated, nanosized nucleation Si islands 16 disposed on an $SiO_2$ layer 17 (FIGS. 1(a)–1(c)), and upon which the GaN epilayer 14 is grown (FIGS. 1(b), 1(c)). The epilayer 14 is grown as a plurality of stacked epitaxial film layers 18 on top of each nucleation island 16 or as a single epitaxial layer on each nucleation island. Although not specifically illustrated, the nanosized nucleation islands 16 are all three dimensional in configuration, as will be apparent to those skilled in the art.

As illustrated in FIG. 1(a), the nanoscale nucleation Si sites 16 are disposed on top of the $SiO_2$ layer 17. The selectivity of the growth means that the epilayer growth rate will be higher at the Si nucleation sites than on the $SiO_2$ layer. However, other ways of forming nanoscale nucleation sites from materials having differential affinity for the epilayer material are contemplated. For example, the nanoscale nucleation sites could be provided by a first material (e.g. Si) from a group comprising (i) a substantially homogeneous thin film and (ii) a bulk substrate, and overlaying the first material with the second material (e.g. $SiO_2$) within which holes are formed to expose nanoscale regions of the first material. Furthermore, the first material could have nanoscale posts etched therein, and the area between the nanoscale posts being filled with the second material, leaving only substantially the tops of the nanoscale posts exposed to the growth of the thin film epilayer.

Moreover, as illustrated in FIG. 1(c), stress (and strain) are apportioned between the nanoscale nucleation and the epilayer. In FIG. 1(c), the vertically extending lines in the nanoscale nucleation site 16 and in the epilayer 14 depict substantially stress (and strain) free zones, and the angled lines depict stress (and strain) zones. As illustrated, the stress (and strain) zones are disposed at and are apportioned between the interface of the nanoscale nucleation site 16 and the epilayer 14.

Figure 6:
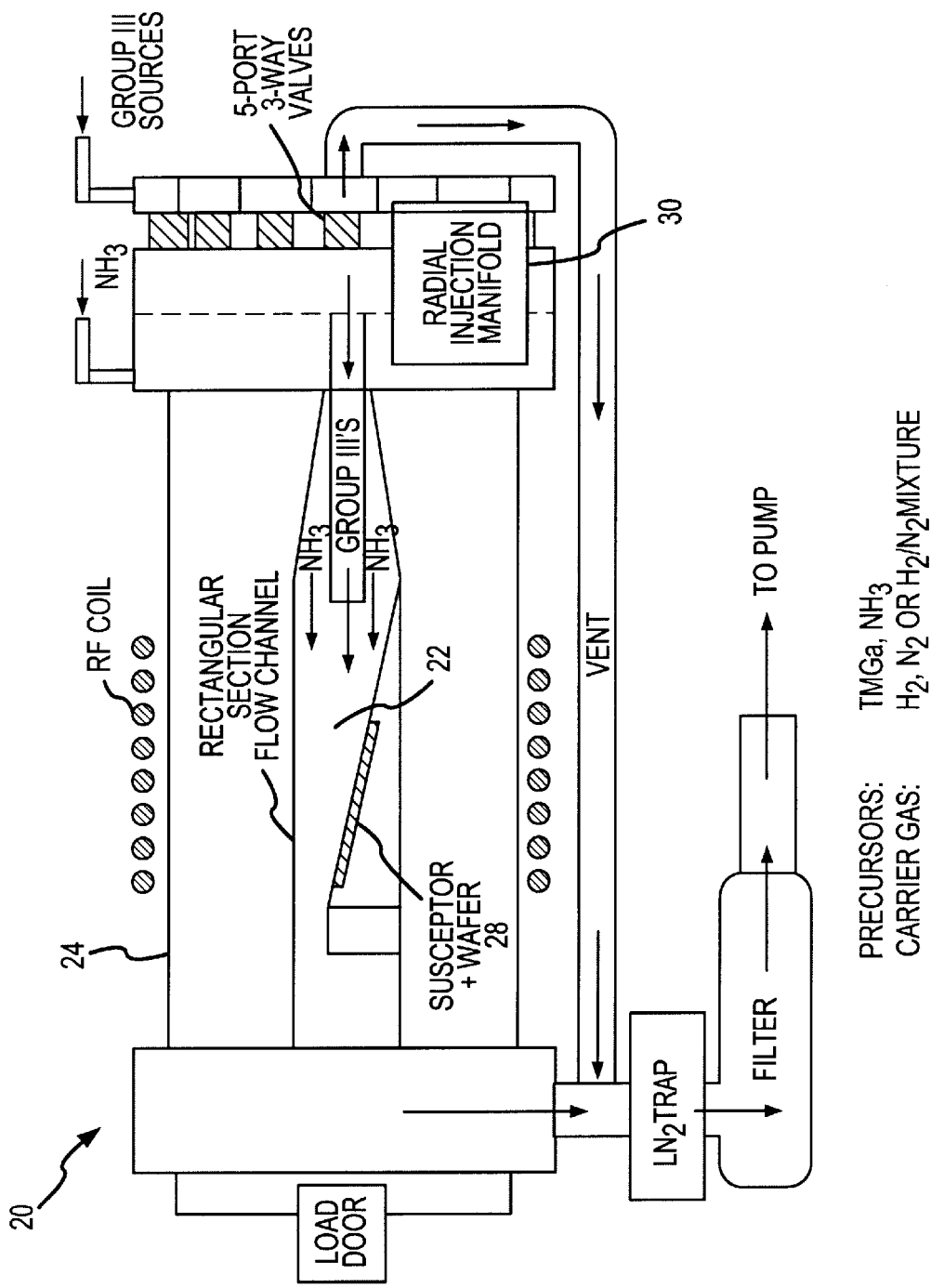
FIG. 6 is a schematic illustration of a system for growing a GaN epilayer on an SOI substrate by organometallic vapor phase epitaxy growth techniques.

The GaN epilayer 14 is grown on the nanosized nucleation islands 16 by organometallic vapor phase epitaxy growth techniques. Specifically, the epitaxial GaN film layers 18 are grown onto the nucleation islands 16 using a OMVPE system 20 of the type shown in FIG. 6. The system 20 has a reaction zone 22, a double walled deposition (or reaction) chamber 24, a rectangular-section flow liner 26 and an RF heated graphite susceptor 28 angled for optimum uniformity. Trimethylgallium, trimethylindium, trimethylaluminum and high purity ammonia sources are used with a hydrogen or nitrogen carrier gas and these are injected into the reaction chamber 24 via a custom radial injection manifold 30. This manifold 30 features fast switching for group III metals and dopants and permits the separate injection of the group III metals and ammonia source flows.

For normal (planar) growth the sequence is as follows: After an in situ cleaning of the substrate in hydrogen at 1100° C., a low temperature GaN buffer is deposited at a temperature between 480° C. and 600° C. The substrate temperature is then raised to 1040° C. under an ammonia flow and allowed to stabilize at this temperature. The main GaN epilayers are then grown at 1040° C. and at a chamber pressure of 100 Torr. Using a hydrogen flow of 40 scm through the TMGa bubbler, a TMGa bubbler temperature of −10° C., an NH3 flow of 3.0 slm and a hydrogen make up flow of 1.5 slm the GaN growth rate is 2 μm hr−1. Further details of the GaN growth procedure can be found in a 1995 Journal of Electronic Materials article by S. D. Hersee, J. Ramer, K. Zheng, C. F. Kranenberg, K. Malloy, M. Banas and M. Goorsky, entitled "The Role of the Low Temperature Buffer Layer and Layer Thickness in the Optimization of OMVPE Growth of GaN on Sapphire". That article, a copy of which is attached as Exhibit C, is incorporated by reference herein.

These growth conditions, in particular the growth rate, are modified to obtain the selectivity and quality of the GaN that are required for this invention. At low growth rate, the depositing species have time to migrate across the $SiO_2$ mask layer to the GaN island and a GaN film with excellent morphology results. Under these conditions, there is no deposition on the $SiO_2$ mask up to 50 μm away from the GaN island and good selectivity is obtained. At high growth rate the growth is less selective, and the morphology of the GaN is substantially degraded.

The growth sequence begins with the selective growth of GaN nanoisland films. After the GaN epilayer thickness exceeds the effective range of the strain, and unstrained, high quality GaN is being grown, the growth conditions are altered to promote lateral growth to achieve coalescence of the nanoisland films into a continuous epilayer. This is accomplished by techniques such as changing temperature and V/III (molar) ratio, that are more fully described in a 1986 Journal of Crystal Growth paper of S. D. Hersee, E. Barbier and R. Blondeau entitled "A Study of the Orientation Dependence of Ga(Al) As Growth by MOVPE" (that paper which further describes the state of the art in film growing techniques is incorporated by reference herein). Moreover, with selective growth of GaN on the nanosized SOI islands 14, where the Ga species exhibit a high surface mobility on the $SiO_2$, the concentration of Ga will normally be higher on the sidewalls of the growing GaN than on the GaN surface. Reducing the TMG flow further enhances this relative difference in concentration, and further enhances lateral growth.

Once coalescence has been achieved in the epilayer, the bulk of the heteroepitaxial film will be grown in a third and final stage of epitaxy. State of the art techniques for growing thick GaN film layers (1 to 6 μm) can be used to complete the epilayer.

It is believed that the following discussion is useful in understanding the manner in which the present invention reduces strain at the epilayer/substrate interface, localizes strain to inactive portions of a thin film product, and promotes reduction in strain with increasing epilayer thickness with GaN epilayer on a SOI substrate. In contrast to current lateral epitaxial growth approaches, [for example, as reported in H. Marchand, X. H. Wu, J. P. Ibbotson, P. T. Fini, P. Kozodoy, S. Keller, J. S. Speck, S. P. DenBaars, U. K. Mishra, "Microstructure of GaN Laterally Overgrown by Metal Organic Chemical Vapor Deposition," Appl. Phys. Lett. 73, 747 (1998).] where the patterning is on the scale of 1–10 μm, the nanoscale patterning in nanoheteroepitaxy according to the present invention allows enhanced stress relief mechanisms to operate. The present invention promotes partitioning of strain at the epilayer/substrate interface as a result of increased compliance of the nanosized islands as the film thickness increases. In addition to strain partitioning in which some of the strain is accommodated in the nanosized substrate islands, stress in the nanoheteroepitaxy sample decays exponentially away from the GaN/SOI heterointerface with a characteristic decay length proportional to the diameter of the nanosized islands (which are substantially uniform in configuration). Strain partitioning and stress decay interact synergistically to significantly lower the strain energy associated with the nanostructural lattice mismatched heterogeneous interface. Nanoheteroepitaxy theory predicts that mismatch dislocation formation can be eliminated from materials systems with a lattice mismatch in the range of 0–4.5% for nanoisland diameters of ~50 nm. In material systems with larger lattice mismatch such as GaN on Si (20% lattice mismatch) some level of defects are likely, however as described herein nanoheteroepitaxy results in a significant reduction in the local defect density in nanostructural GaN/Si islands. Furthermore, the structure and orientation of these defects is modified in nanoheteroepitaxy and they remain localized at the heterointerface. As described above, FIG. 1(c) schematically illustrates the manner in which stress (and strain) are apportioned between a nanoscale nucleation site and an epilayer, according to the present invention.

Figure 2A:
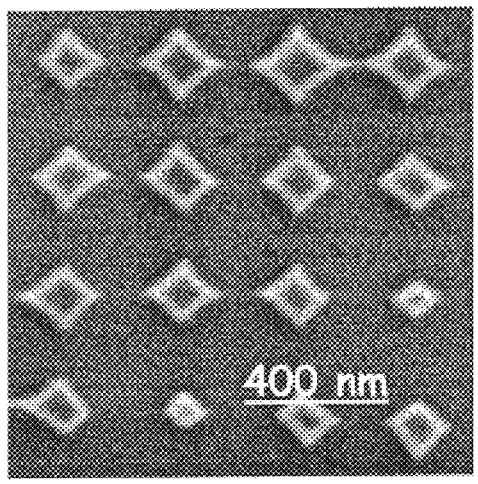
FIG. 2 compares the patterned SOI substrate before (a) and after (b) heating to 1054° C. in a reducing atmosphere, and indicates that the silicon islands of the substrate have restructured, indicating that the increase surface-to-volume ratio produced by the nanostructuring significantly modifies the material properties from those of bulk material of the same constituents.
Figure 2B:
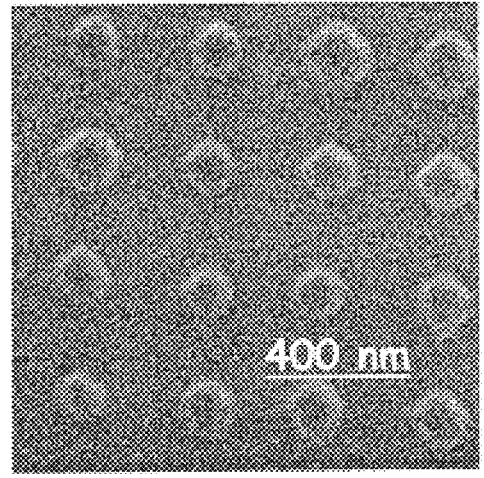

In addition to exploiting 3-dimensional stress relief mechanisms due to geometrical effects, nanostructuring can also enable other stress relief effects due to the large surface-to-volume ratio of nanoscale structures. For example, in material systems in which the epitaxial material has a higher melting point than the substrate, which include GaN growth on Si, compliance can be actively enhanced due to softening of the nanoscale substrate islands at growth temperatures well below the substrate bulk melting point. Evidence of substrate softening is shown in FIG. 2 which compares the size and shape of silicon nanometer sized islands (a) without and (b) with heat treatment at 1054° C. for 10 minutes. FIG. 2 shows that mass transport has occurred due to melting in the heat-treated sample. This indicates that the melting point for these silicon islands has been reduced from its bulk value of 1412° C. to less than 1110° C. The in-situ cleaning temperature previously used for GaN growth on sapphire[1] is 1100° C., however, because of this observed melting the in-situ clean temperature has been reduced to 878° C. A reduction of melting point is anticipated from recent results on nanophase materials which has shown that the materials properties (including the melting point) of nanometer scale particles are significantly modified[2]. In the case of nanoheteroepitaxy this reduced melting point can be utilized during growth to soften the silicon islands (i.e., reduce their elastic modulus) and enhance substrate compliance. This effect is referred to herein as active compliance.

[1] S. D. Hersee, J. Ramer, K. Zheng, C. F. Kranenberg, K. Malloy, M. Banas and M. Goorsky, Electron. Mat. 24, 1519 (1995). A copy of that article is Exhibit C hereto, and the article is incorporated by reference herein.

[2] A. Goldstein, Handbook of nanophase materials, Marcel Dekker, New York, pp. 3–4 (1997). That material which further describes the state of the art of nanophase materials, and is incorporated by reference herein.

Figure 3:
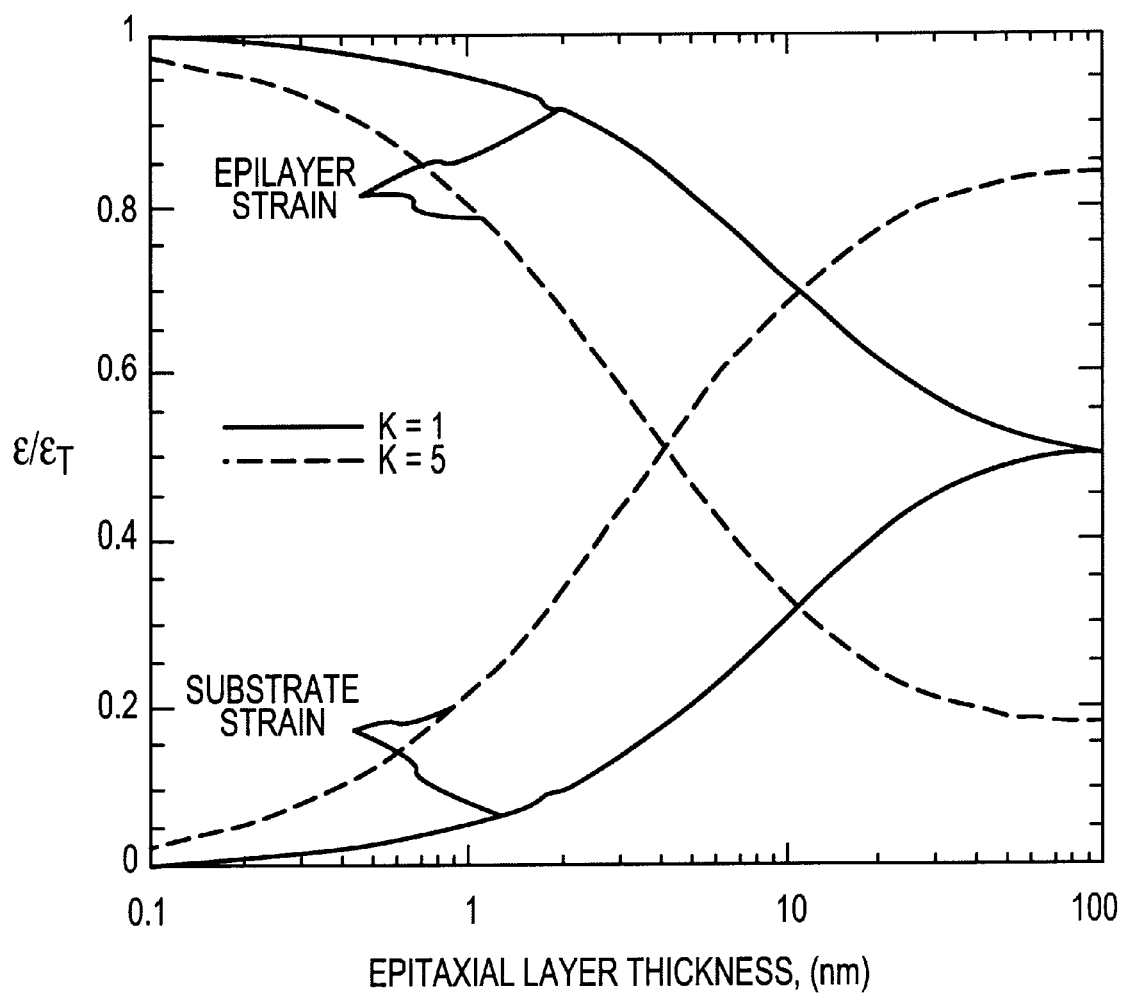
FIG. 3 plots normalized strain in an epilayer versus epilayer thickness, and specifically demonstrates the effect of active compliance.

Active compliance can be incorporated in the strain partitioning equations 1 by adjusting the elastic compliance ratio, K, given by $$K = Y_{eip}(1-v_{sub})/[Y_{sub}(1-v_{epi})] \quad (1)$$

where Y is Young's modulus and v the Poisson's ratio in the epitaxial material and the substrate materials. At low temperatures, well below the actual melting point of the epitaxial and substrate materials, the Young's moduli of these materials are equal to their respective bulk values. For a higher growth temperature, near the reduced melting point of the substrate island, $Y_{sub}$ will be reduced causing K to be increased above its bulk value, $K_o$. The impact of active compliance on strain partitioning is illustrated in FIG. 3, which shows the effect that increasing K has on the normalized strain, $\epsilon/\epsilon_T$, in the epitaxial and substrate layers, where T is the total mismatch strain. It is not known at this time by how much the value of K can be increased beyond $K_o$, however, to illustrate the active compliance effect, an increased value of 5 $K_o$, was arbitrarily chosen for comparison in FIG. 3. The graph shows that active compliance enhances strain partitioning by increasing the partitioning at a given thickness and increasing the ultimate degree of strain partitioning. In addition, active compliance works to directly lower the total strain energy in the system when $Y_{sub}$ is reduced because strain energy is proportional to the Young's modulus.

Island size is a critical parameter in nanoheteroepitaxy as it controls both the elastic modulus through the actual melting point of the substrate island and the characteristic decay length of the strain energy. During selective epitaxy, the island size and spacing will also control the effective growth rate at the island. In addition to island size, other important aspects of the patterning include: distance between islands, pattern symmetry, nanoelement symmetry, and macroscale isolated growth areas. A description of the aspects of interferometric lithography and patterning that can be used to control these parameters includes:

| Nanostructure Parameter | IL approach |
|---|---|
| Pattern periodicity | Vary incident angles {$p = \lambda/[2\sin(\theta)]$}, nonlinear processes to increase spatial frequencies as in '428 patent application (Exhibit B) |
| Nanostructure size | Vary exposure flux, use photoresist and other process nonlinearities |
| Pattern symmetry | Number and orientation of beams |
| Nano-element symmetry | Multiple exposures, hard masks, additional nonlinearities |
| Localized growth areas | Imaging interferometric lithography, integration of convention optical and interferometric lithographies, hard masks |

The limiting pitch for conventional IL is $\lambda/2$. To date, formation of the nanoscale nucleation sites have been carried out at wavelengths of 364 nm (Ar-ion laser) or 355 nm (third harmonic of YAG) with a limiting period of ~180- to 200-nm. This wavelength range was chosen to be compatible with well-developed, commercially available i-line photoresists. With the advent of availability of 193-nm resists developed for ArF based photolithography, formation of the nanoscale nucleation sites can be carried out with ~125-nm pitches with a fifth harmonic YAG source at 213 nm. Additionally, nonlinear processes of the type disclosed in the '428 application (Exhibit B) can further extend lithographic capabilities to higher density (smaller pitch) patterns.

The nanostructure size can be controlled by varying the exposure/development and pattern transfer parameters. Specifically, the pattern symmetry can be controlled by adjusting the IL parameters including number of beams and number of exposures, and by other processing steps disclosed in the '428 patent application (Exhibit B), and in more detail in Saleem H. Zaidi and S. R. J. Brueck, "Nonlinear Processes to Extend Interferometric Lithography," Proc. SPIE 3676, 371–378, (1999) (Exhibit D hereto).]

Moreover, defined areas of nanostructures can be generated by combining IL with conventional optical lithography to define larger areas. For example, an interdigitated detector structure can be generated where the contact areas are defined by conventional lithography and the areas between the electrodes are patterned with IL.

In the creation of a GaN epilayer on a SOI substrate, according to the principles of the present invention, nanoheteroepitaxy was achieved using organometallic vapor phase epitaxy (OMVPE) growth of GaN on the patterned surface silicon layer of commercial <111> silicon-on-insulator (SOI) wafers manufactured by the separation by implantation of oxygen (SIMOX) process. The SOI wafers were patterned using interferometric lithography and reactive ion etching to form a square 2-dimensional array of silicon islands on top of a field of $SiO_2$ (see FIG. 1). The height of the islands was 40 nm while the diameter varied from 80 to 300 nm. Island periodicities of 360- and 900-nm were investigated. As discussed above, these and other aspects of the nanoisland substrate parameters can be varied over a wide range using the capabilities of interferometric lithography and imaging interferometric lithography as well as other nanolithography techniques. GaN was then selectively grown on the silicon islands using a three step sequence consisting of an in-situ cleaning at a temperature of 878° C. for 5 minutes under a hydrogen atmosphere, a low temperature (543° C.) nucleating layer deposition and finally main epilayer growth at high temperature (1031° C.). This yielded a GaN island thickness of 100 to 200 nm. The exposed $SiO_2$ layer of the SOI served as a convenient mask for the selective growth of GaN on silicon. The SOI structure allowed efficient implementation of the patterning and selective growth requirements of the nanoheteroepitaxy approach.

Figure 4A:
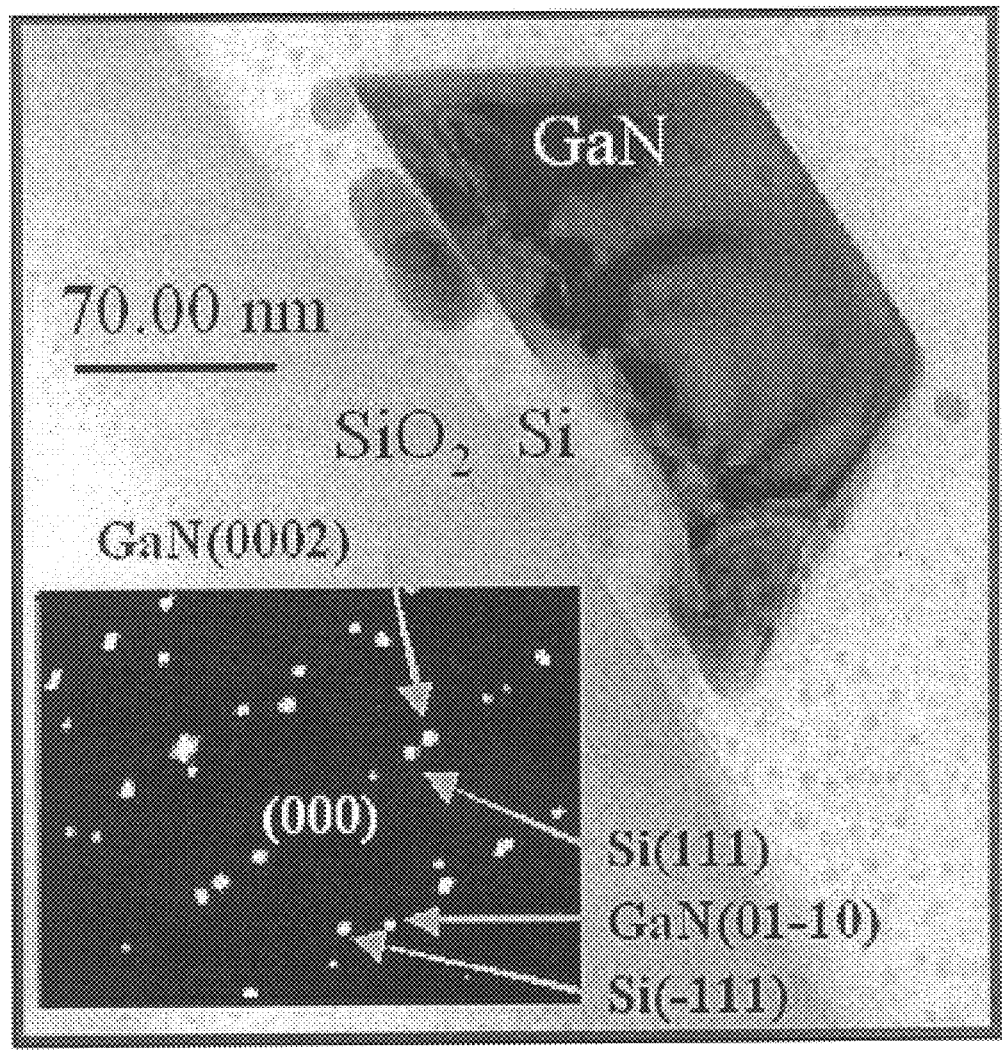
FIGS. 4(a), (b) are cross sectional TEM micrographs of GaN grown on Si islands on a patterned SOI substrate.
Figure 4B:
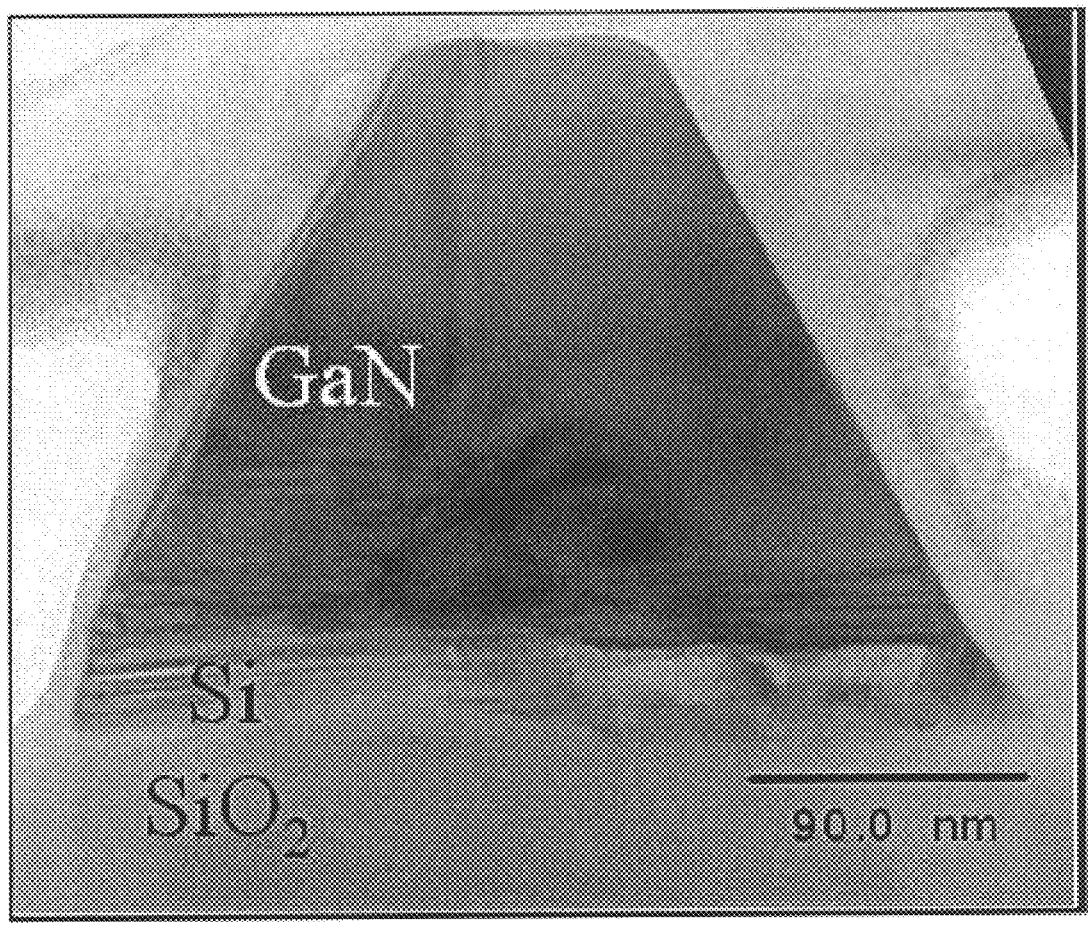

Cross-section transmission electron microscopy (XTEM) micrographs of GaN growth on two silicon islands, one 80 nm in diameter and the other 280 nm in diameter, are shown in FIG. 4. In both cases the defects are concentrated near the GaN/Si heterointerface and the defect density decays rapidly to vanish at approximately 20–50 nm from the interface. In FIG. 4a, strain field contours can be observed in the defect-free region. The general shape of the strain contours indicates that the strain originates at the GaN/Si heterointerface. The contour lines broaden and separate, away from the heterointerface, indicating a decaying strain field in agreement with the predictions of nanoheteroepitaxy theory. Lateral growth of GaN, extending beyond the edges of the silicon island, is also observed. The electron diffraction pattern from the sample in FIG. 4a (inset) reveals the relative crystallographic orientation of GaN and Si as GaN [0001]//Si[111]. Thus the silicon island is acting as an epitaxial template. FIG. 4b (the 280 nm diameter seed) shows a threading dislocation in the GaN, indicating that the mechanism that creates threading dislocations was not suppressed sufficiently to prevent the formation of the threading dislocation in this particular island. FIGS. 4a and 4b also show that GaN grows preferentially on the (111) surface of the silicon island, suggesting that selective growth via crystallographic orientation (i.e. use surface patterning instead of using an oxide mask) may be achievable for this material system.

Figure 5A:
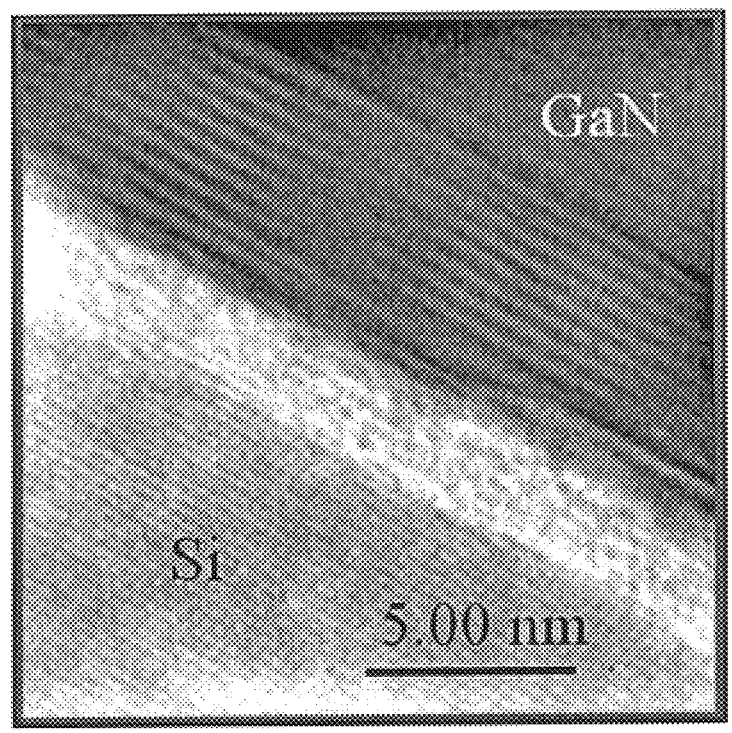
FIGS. 5(a), (b) are high resolution TEM micrographs of (a) GaN/Si heterointerface and (b) GaN away from the interface.
Figure 5B:
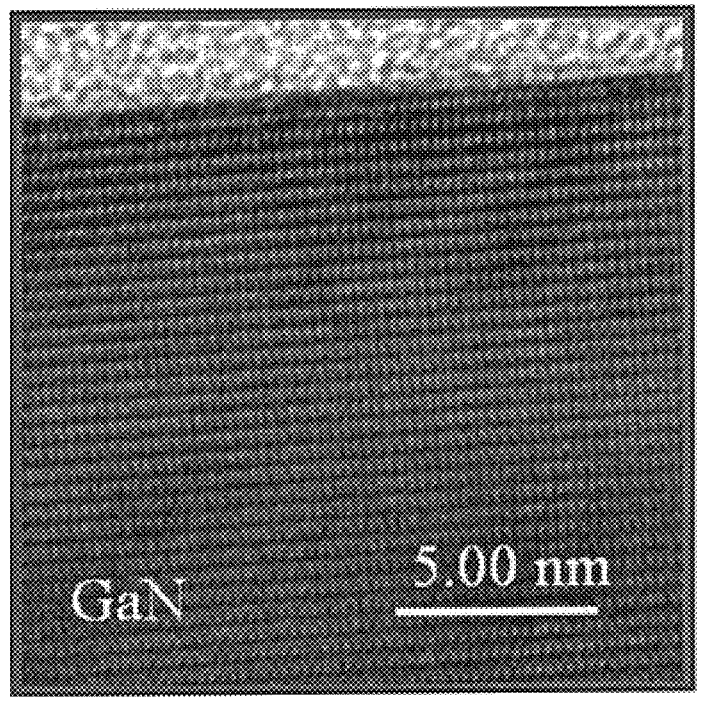

High-resolution XTEM (FIG. 5) reveals stacking faults in the GaN near the interface (FIG. 5a) and a highly defected silicon layer at the interface. Segmented silicon lattice planes lying within the 2.0 nm thick defected layer, in some areas penetrating as much as three lattice planes (0.95 nm) into the layer, indicate that the layer is composed of silicon, implying that much of the mismatch strain is being taken up by the silicon. FIG. 5b shows that GaN is locally of highly quality away from the interface.

Accordingly, the principles of the present invention can be used to produce a thin film product such as a GaN epilayer on an SOI substrate, where the SOI substrate comprises a series of discrete nanosized islands, and strain defects are substantially reduced in the GaN epilayer. GaN and alloys such as InGaN and AlGaN are emerging wide-gap semiconductor materials with application in optoelectronics, high temperature electronics and high power electronics. As a result of the substantial lattice-mismatch with available substrate materials, GaN, and more generally AlGaInN, as an epilayer is difficult to grow completely defect free, but the ability to reduce defect density in thin GaN epilayer films is significant for many device applications.

Still further, while the present invention is particularly useful in growing epitaxial layer structures on patterned substrates having nanoscale nucleation sites, the present invention is believed to have broader application in providing other types of thin film structures on patterned substrates having nanoscale nucleation sites. For example, the principles of the present invention are believed useful in reducing the strain in any thin film structure involving two or more dissimilar materials where strain results from differences in thermal expansion coefficients. Two cases should be considered.

In case 1 the sample is not coalesced, i.e. it remains an array of discrete nucleii with a thin film structure atop each nucleus. Here any thermally induced strains will be in addition to the lattice mismatch strain that may or may not be present. This thermal strain will be accommodated in the same way as lattice mismatch strain and the benefits described for the present invention with regard to lattice mismatch strain are directly applicable to thermally induced strain. A product of this type might be an electronic or optoelectronic device where individual devices are formed on each nucleus or where the interaction of electrons or photons with the array of nucleii is part of the device operation.

In case 2 the thin film structure has been deposited on the nanoscale patterned substrate and coalescence of the thin film structure has taken place. In this type of sample the invention is expected to exhibit an enhanced ability to accommodate thermally induced strain. This is especially anticipated if the nanoscale islands are fabricated with a large ratio of height to diameter where the substrate nucleii have mechanical flexibility and their tips can undergo lateral translation in response to thermally induced strain. Clearly, this process depends on the film area. It is easier to accommodate the expansion difference the smaller the film area. A product of this type might be an electronic or optoelectronic device, in which the coalesced film is the host material for the device operation. A further product of this type might be a mechanical, chemical or optical device which relies on achieving a robust adhesion between two different materials. The enhanced accommodation of thermally induced strain in the present invention would be expected to improve adhesion and reduce the number of strain related defects of such a structure, whether it were fabricated from amorphous, polycrystalline or crystalline materials.

With the foregoing disclosure in mind, it is believed that use of the principles of the present invention to grow other types of thin film electronic products will be apparent to those in the art.

What is claimed is:

1. A thin film product, comprising a patterned substrate comprising a plurality of isolated nanoscale nucleation sites, and a thin film structure selectively disposed on said nanoscale nucleation sites; said thin film structure extending to a thickness at which said thin film structure is substantially strain free.

2. A thin film product as defined in claim 1, wherein said thin film structure comprises material which is different than the material of said nanoscale nucleation sites.

3. A thin film product as defined in claim 2, wherein said nanoscale nucleation sites are formed by a first material and a second material, said first and second materials having differential selectivity for the material of said thin film structure.

4. A thin film product as defined in claim 3, wherein said nanoscale nucleation sites are formed of the first material and are situated atop the second material.

5. A thin film product as defined in claim 3, wherein said nanoscale nucleation sites comprise:
  a. the first material which is either (i) a substantially homogeneous thin film or thin film structure on top of a bulk substrate or (ii) a bulk substrate; and
  b. a second material overlaying the first material with the second material having holes to expose nanoscale regions of the first material.

6. A thin film product as defined in claim 3, wherein said nanoscale nucleation sites comprise:
  a. the first material as either (i) a substantially homogeneous thin film or thin film structure on top of a bulk substrate or (ii) a bulk substrate; and in either case etched nanoscale posts; and
  b. the second material filling the area between said nanoscale posts with the second material leaving only substantially the tops of said nanoscale posts exposed to said thin-film structure.

7. A thin film product as defined in any of claims 1–6, wherein said thin film structure comprises an epitaxial thin film structure.

8. A thin film product as defined in claim 7, wherein said isolated nanoscale nucleation sites comprise oriented, single crystal material.

9. A thin film product as defined in claim 3, wherein said first material comprises oriented, single crystal silicon.

10. A thin film product as defined in claim 3, wherein said first material comprises oriented, single crystal silicon and said second material comprises silicon dioxide.

11. A thin film product as defined in claim 9, wherein said thin film structure comprises a Group III nitride.

12. A thin film product as defined in claim 11, wherein said thin film structure comprises GaN.

13. A thin film product as defined in claim 7, wherein said thin film structure is configured with lateral overgrowth which provides coalescence of the thin film structure.

14. A thin film product as defined in claim 13, further including additional film structure disposed on top of the coalesced thin film structure.

15. A thin film product as defined in claim 14, wherein said thin film structure comprises a multi layer thin film structure.

16. A thin film product as defined in claim 7, wherein said thin film structure comprises a multi layer thin film structure.

* * * * *